US012108555B2

(12) United States Patent
Mohanasundaram et al.

(10) Patent No.: US 12,108,555 B2
(45) Date of Patent: Oct. 1, 2024

(54) INTERCONNECTING MODULE CONFIGURED FOR INTERCONNECTING COMPUTING UNITS IN A HPC CABINET AND A METHOD FOR ENGAGING SAID INTERCONNECTING MODULE

(71) Applicant: BULL SAS, Les Clayes-sous-Bois (FR)

(72) Inventors: Sakthivel Mohanasundaram, Thanjavur (IN); Vishwas Bs, Bangalore (IN)

(73) Assignee: BULL SAS, Les Clayes-sous-Bois (FR)

( * ) Notice: Subject to any disclaimer, the term of this patent is extended or adjusted under 35 U.S.C. 154(b) by 303 days.

(21) Appl. No.: 17/707,919

(22) Filed: Mar. 29, 2022

(65) Prior Publication Data

US 2022/0322558 A1    Oct. 6, 2022

(30) Foreign Application Priority Data

Apr. 4, 2021   (EP) .................................... 21166863

(51) Int. Cl.
*H05K 7/14*    (2006.01)
*H05K 5/00*    (2006.01)
*H05K 5/02*    (2006.01)

(52) U.S. Cl.
CPC ......... *H05K 7/1407* (2013.01); *H05K 5/0021* (2013.01); *H05K 5/0204* (2013.01)

(58) Field of Classification Search
CPC .... H05K 7/1407; H05K 5/002; H05K 5/0204; H05K 7/1492; H05K 7/1489; H05K 7/20781; H05K 7/1409; G06F 1/266; G06F 1/28; G06F 1/18; G06F 1/183; H04Q 1/025; H04Q 1/03; H04Q 1/035; H01H 23/12; H01H 2231/002; H01R 25/006;
(Continued)

(56) References Cited

U.S. PATENT DOCUMENTS 6,052,288 A * 4/2000 Roscoe ................ H05K 7/1409
                                                          361/752
6,354,164 B1   3/2002 Megason et al.
(Continued)

OTHER PUBLICATIONS

European Search Report issued in EP21166863.7, dated Sep. 17, 2021 (8 pages).

*Primary Examiner* — Daniel C Puentes
*Assistant Examiner* — Peter Krim
(74) *Attorney, Agent, or Firm* — ARC IP Law, PC; Joseph J. Mayo

(57) ABSTRACT

An interconnecting module configured to be mounted in a High-Performance Computing (HPC) cabinet in order to interconnect a plurality of computing units located in the HPC cabinet. The interconnecting module comprising a chassis configured to be mounted horizontally within housings defined in the computing units, a plurality of connection units spaced vertically, each connection unit being configured to be connected to a motherboard of a computing unit, the connection units being interconnected, each connection unit comprising at least a fastening member configured to cooperate with a housing of a computing unit, a vertical rack cooperating with all the fastening members and at least a main lever mounted pivotally on the chassis, the main lever being configured to move the vertical rack vertically in order to engage/disengage all the fastening members simultaneously.

13 Claims, 11 Drawing Sheets

(58) Field of Classification Search
CPC .... F16H 51/00; F16H 19/04; Y10T 74/18976; Y10T 74/20672; Y10S 439/905
See application file for complete search history.

(56) References Cited

U.S. PATENT DOCUMENTS

| | | |
|---|---|---|
| 10,197,084 B1 * | 2/2019 | Ankney .............. H05K 5/0221 |
| 10,420,246 B2 * | 9/2019 | Heinrichs ............ H05K 7/1489 |
| 2016/0124470 A1 | 5/2016 | Leigh et al. |
| 2020/0214164 A1 | 7/2020 | Doll et al. |

\* cited by examiner

INTERCONNECTING MODULE CONFIGURED FOR INTERCONNECTING COMPUTING UNITS IN A HPC CABINET AND A METHOD FOR ENGAGING SAID INTERCONNECTING MODULE

The present invention relates, in general, to high-performance computing and, more specifically, to an interconnecting module configured for interconnecting computing units in a HPC cabinet.

A datacenter comprises several high-performance computing cabinets, called HPC cabinets or "clusters", arranged in rows within the datacenter and configured to house computing units, such as servers, switches and routers, to organize, process and store data. Each computing unit comprises conventionally at least one mother board and several components secured to the mother board such as processors, Dual In-Line Memory Module (DIMM), a PCIe component (GPU, FPGAs)), fans, etc.

In order for several computing units to work together, it is known to use an interconnecting module. Solutions known to address such requirement of the industries include Ultra Path Interconnect (UPI) technology which provides a scalable multiprocessor system, for example, by linking motherboards of two or more computing units together. The engaging/disengaging of the interconnecting module requires to screw/unscrew which requires effort and time to be invested by the user.

In order to eliminate these drawbacks, the patent application EP21154558 discloses an interconnecting module with horizontal levers in order to fasten the interconnecting module to two computing units at the same time. Such a solution is convenient but requires the user to exert a significant force on the horizontal levers so that the connectors of the interconnecting module mate with the connectors of the computing units.

A problem occurs when the interconnecting module must interconnect more than two computing units, for example, 4 computing units. The required force for the mating is too high for a user and may lead to damages.

Accordingly, it is one object of the present disclosure to provide a user-friendly interconnecting unit which reduces effort and time to be invested by the user.

PRESENTATION OF THE INVENTION

The invention is related to an interconnecting module configured to be mounted in a High-Performance Computing cabinet, thereafter HPC cabinet, in order to interconnect a plurality of computing units located in the HPC cabinet, the interconnecting module comprising:
  A chassis configured to be mounted horizontally within housings defined in the computing units,
  A plurality of connection units spaced vertically, each connection unit being configured to be connected to a motherboard of a computing unit, the connection units being interconnected,
  Each connection unit comprising at least a fastening member configured to cooperate with a housing of a computing unit The invention is remarkable in that the interconnecting module comprises at least a vertical rack cooperating with all the fastening members and at least a main lever mounted pivotally on the chassis, the main lever being configured to move the vertical rack vertically in order to engage/disengage all the fastening members simultaneously.

Thanks to the invention, the user strength required to interconnect several computing units is amplified by the main lever and then divided equally to make the connection. The engagement of the interconnecting unit is simple, tool-less and reduces the risk of damages.

Preferably, the interconnecting module comprises at least four connection units in order to interconnect at least four computing units located in the HPC cabinet.

According to a preferred embodiment, each fastening member is a pivotable pinion. The teeth of the fastening member allow a stable engagement and ejection during disengagement.

Preferably, each fastening member comprises at least a primary tooth configured to engage with the corresponding housing.

According to an aspect of the invention, the main lever comprises a main pinion cooperating with the vertical rack.

According to an aspect of the invention, the interconnecting module comprises a locking system configured to lock the main lever in the lower position. An accidental disengagement is therefore avoided.

Preferably, the locking system comprises a pushing member configured to cooperate with a hook portion of the main lever.

According to another aspect of the invention, the interconnecting module comprise a supporting system configured to maintain the main lever in an upper position. The interconnecting module can be manipulated by a user without paying attention to the main lever.

Preferably, the supporting system comprises a holding member configured to move between an active position in which the holding member cooperates with the vertical rack and an inactive position in which the holding member is spaced apart from the vertical rack.

The invention also relates to an assembly comprising a plurality of computing units located in the HPC cabinet and an interconnecting module as presented before.

Preferably, each computing unit comprises a central housing for receiving a connection unit of the interconnecting module. Preferably again, each computing unit comprises a horizontal wall with cutouts for cooperating with the fastening members of the connection units.

The invention also related to a method for engaging an interconnecting module, as presented before, in a High-Performance Computing cabinet to interconnect a plurality of computing units located in the HPC cabinet, the method comprising the following steps:
  Inserting the connection units in their corresponding housings of the computing units, and
  Moving the main lever to the lower position to move the vertical rack vertically in order to engage all the fastening members simultaneously so that to connect the connection units to the computing units.

DRAWINGS

A better understanding of embodiments of the present disclosure (including alternatives and/or variations thereof) may be obtained with reference to the detailed description of the embodiments along with the following drawings, in which.

DETAILED DESCRIPTION

Reference will now be made in detail to specific embodiments or features, examples of which are illustrated in the accompanying drawings. Wherever possible, corresponding or similar reference numbers will be used throughout the drawings to refer to the same or corresponding parts. Moreover, references to various elements described herein are made collectively or individually when there may be more than one element of the same type. However, such references are merely exemplary in nature. It may be noted that any reference to elements in the singular may also be construed to relate to the plural and vice-versa without limiting the scope of the disclosure to the exact number or type of such elements unless set forth explicitly in the appended claims.

A datacenter comprises several high-performance computing cabinets, called HPC cabinets or "clusters", arranged in rows within the datacenter and configured to house computing units, such as servers, switches and routers, to organize, process and store data. A HPC cabinet is configured to accommodate multiple server units, switches, cords and cables, rails, cable management bars, routers, path panels, and blanking panels.

High performance computing has gained importance in recent years by several industries which are trending towards increasing sizes or combinations of two or more servers to achieve faster processing performance for a large number of processing operations. Solutions known to address such requirement of the industries include Ultra Path Interconnect (UPI) technology which provides a scalable multiprocessor system, for example, by linking motherboards of two or more computing units together.

Figure 1:
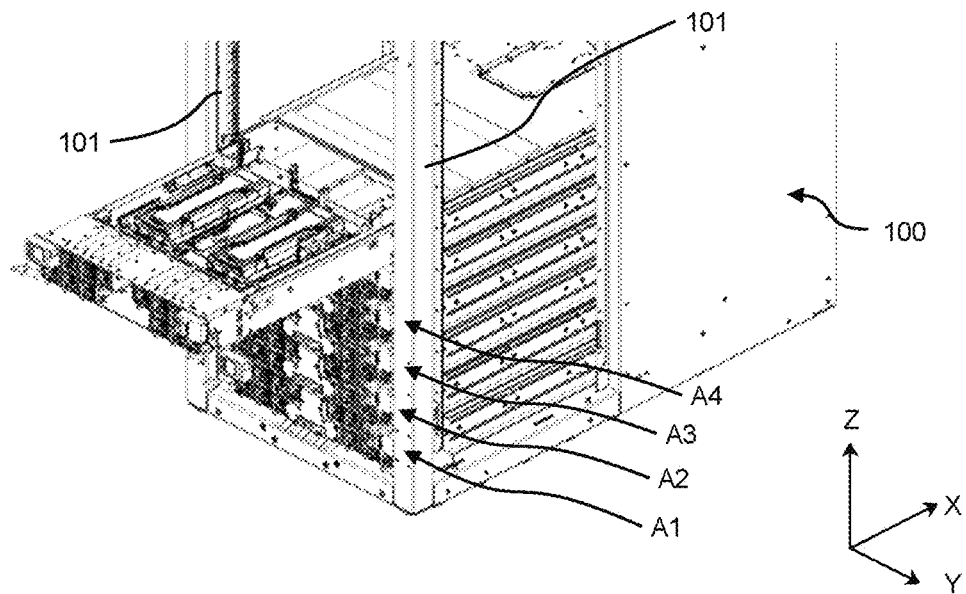
FIG. 1 is an isometric view of a HPC cabinet comprising several computing units.

As illustrated in FIG. 1, a HPC cabinet 100 comprises two vertical side walls 101, delimiting a central cavity with a front opening, so as to define vertically stacked sockets having a standard height (U). Several computing units A1-A4 are housed in the HPC cabinet 100 and mounted onto the two vertical side walls 101.

Figure 2:
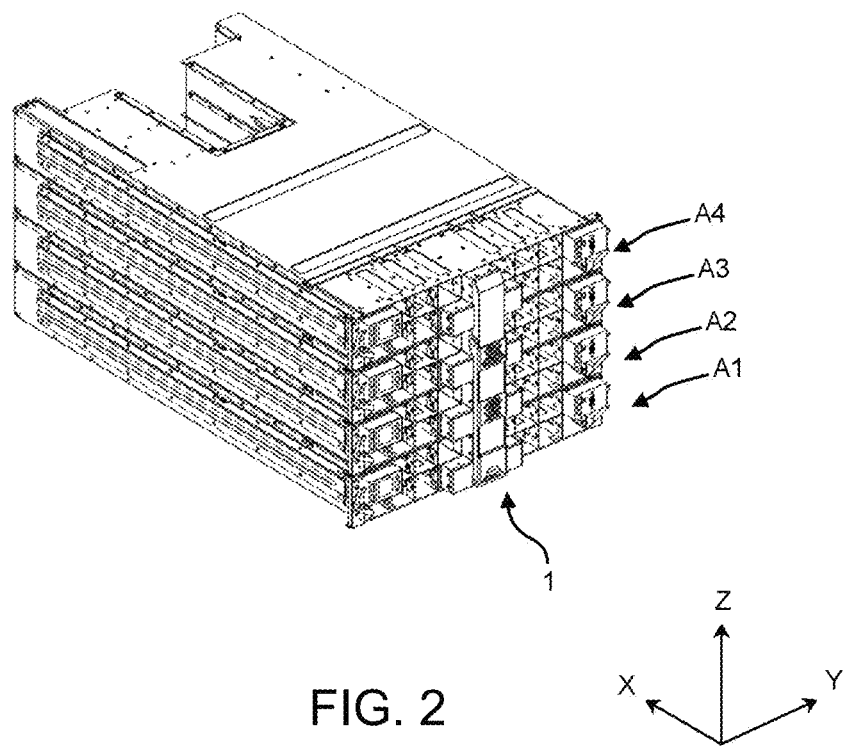
FIG. 2 is an isometric view of 4 computing units.

In this example, the HPC cabinet 100 comprises four computing units A1-A4 which are interconnected together by an interconnecting module 1 represented in FIG. 2. The invention also applies for an interconnecting module 1 for connecting at least two computing units but is very advantageous for more computing units, preferably four.

In this example, the computing units A1-A4 are presented in the (X, Y, Z) referential in which the X axis extends longitudinally from the front to the rear, the Y axis extends laterally from the left to the right and the Z axis extends vertically from the bottom to the top.

Figure 3:
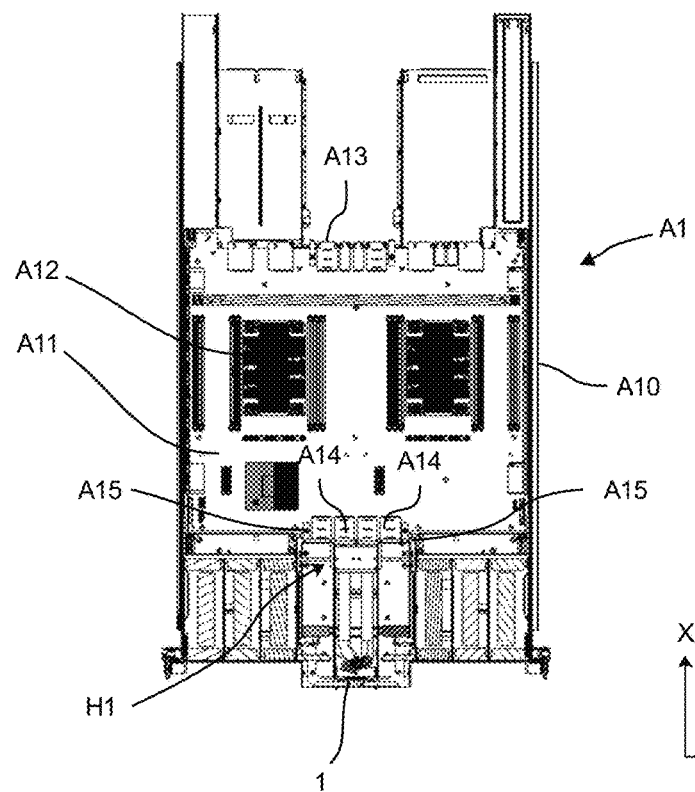
FIG. 3 is a top view of a computing unit.

In this example, all the computing units A1-A4 are similar and only the computing unit A1 is described in FIG. 3.

The computing unit A1 comprises a chassis A10 in which is mounted a mother board A11 comprising several components A12 such as processor components, memory components, etc. The mother board A11 comprises also rear connectors A13 configured to be connected to the HPC cabinet 100 (directly or indirectly) and front connectors A14 configured to be connected to the interconnecting module 1. The computing unit A1 comprises also reception members A15 for guiding the connection as it will be presented later. In this example, the computing unit A1 comprises a central housing H1, opened toward the front, for receiving the interconnecting module 1. The computing unit A1 can be a server, a switch or other.

An interconnecting module 1 according to an embodiment of the invention will be described in FIGS. 4 to 7. The interconnecting module 1 comprises a chassis 10 configured to be engaged horizontally, from the front to the rear along the X axis, within the housings H1-H4 defined in the computing units A1-A4 (See FIG. 14).

Figure 7:
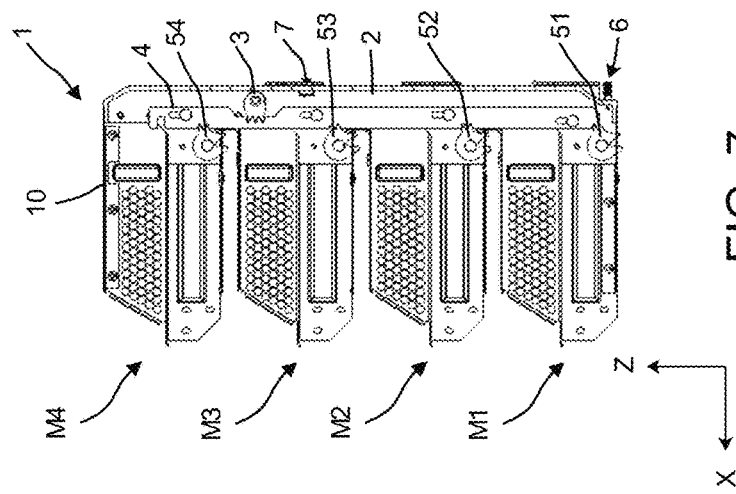
FIG. 7 is a lateral view the interconnecting module from FIG. 6.
Figure 6:
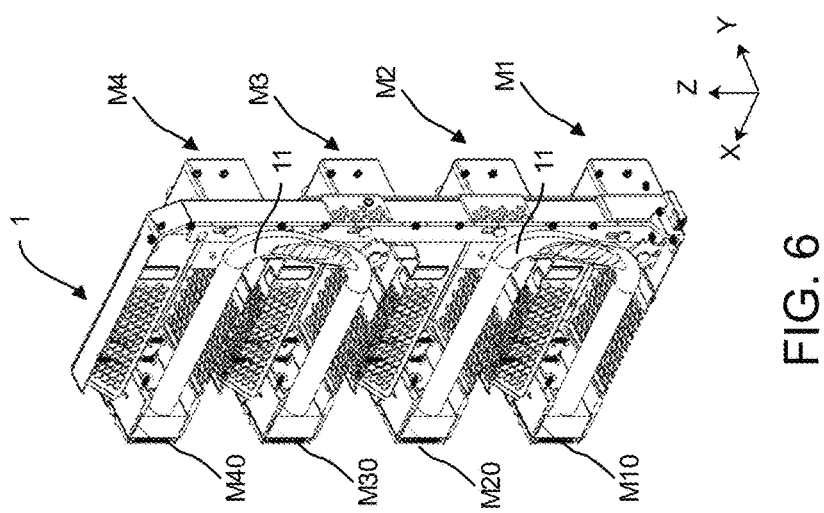
FIG. 6 is a cut view of the interconnecting module from FIG. 4.

The interconnecting module 1 comprises a plurality of connection units M1-M4 spaced vertically, each connection unit M1-M4 being configured to be connected to a mother board of a computing unit A1-A4, the connection units M1-M4 being interconnected thanks to internal cables 11 (see FIG. 6). In this example, the interconnecting module 1 comprises four connection units M1-M4 to interconnect the four computing units A1-A4. As represented in FIG. 7, each connection unit M1-M4 comprises at least a fastening member 51-54 configured to cooperate mechanically with the housing of a computing unit A1-A4.

As represented in FIG. 7, the invention is remarkable in that the interconnecting module 1 comprises at least a vertical rack 4 cooperating with all the fastening member 51-54 and at least a main lever 2 mounted pivotally on the chassis 10, the main lever 2 being configured to move the vertical rack 4 vertically in order to engage/disengage all the fastening members 51-54 simultaneously. Thanks to the invention, the main levers 2 amplifies the force of the user and divides the engaging force equally so that each connection unit M1-M4 cooperates mechanically with a computing unit A1-A4 with an equal engaging force. Damages are advantageously avoided and the user can engage/disengage the interconnecting module 1 without using external tools.

The interconnecting module 1 will be now described in detail.

Figure 4:
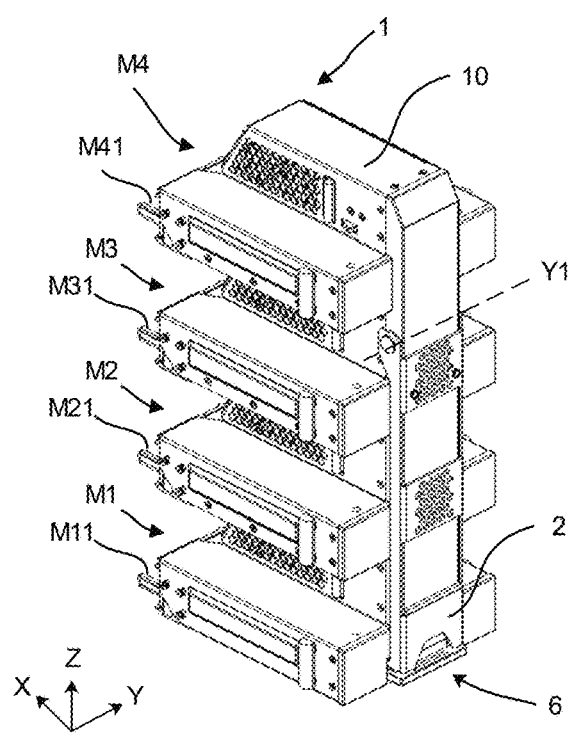
FIG. 4 is an isometric view of an interconnecting module from the front.
Figure 5:
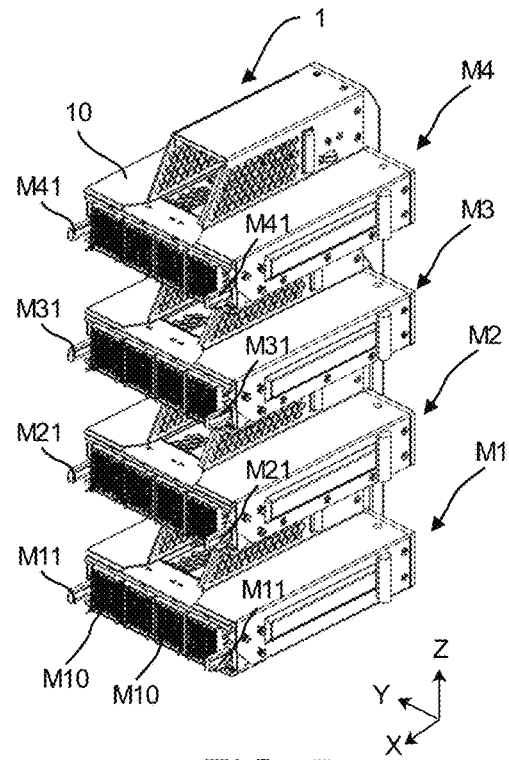
FIG. 5 is an isometric view of the interconnecting module from the rear.

As represented in FIGS. 4 to 6, the connection units M1-M4 are spaced vertically, each connection unit M1-M4 being configured to be connected to a mother board of a computing unit A1-A4. The connection units M1-M4 are similar. Each connection unit M1-M4 comprises connectors M10-M40 configured to be connected to the front connectors the corresponding computing unit A1-A4. In this example, each connection unit M1-M4 comprises four connectors M10-M40 which requires a lot of strength for the mating. The connectors M10-M40 are interconnected (see FIG. 6) so that the computing units A1-A4 can be interconnected. The connectors M10-M40 are located at the rear of each connection unit M1-M4.

Each connection unit M1-M4 comprises at least a guiding member M11-M41 configured to cooperate with a reception member of the corresponding computing unit A1-A4. As represented in FIG. 5, each connection unit M1-M4 comprises two lateral guiding members M11-M41 located on the lateral sides of the connectors M10-M40 to provide guidance when the interconnecting module 1 is engaged/disengaged. In this embodiment, each guiding members M11-M41 is in the shape of a protruding finger extending horizontally along the X axis toward the rear.

Figure 8:
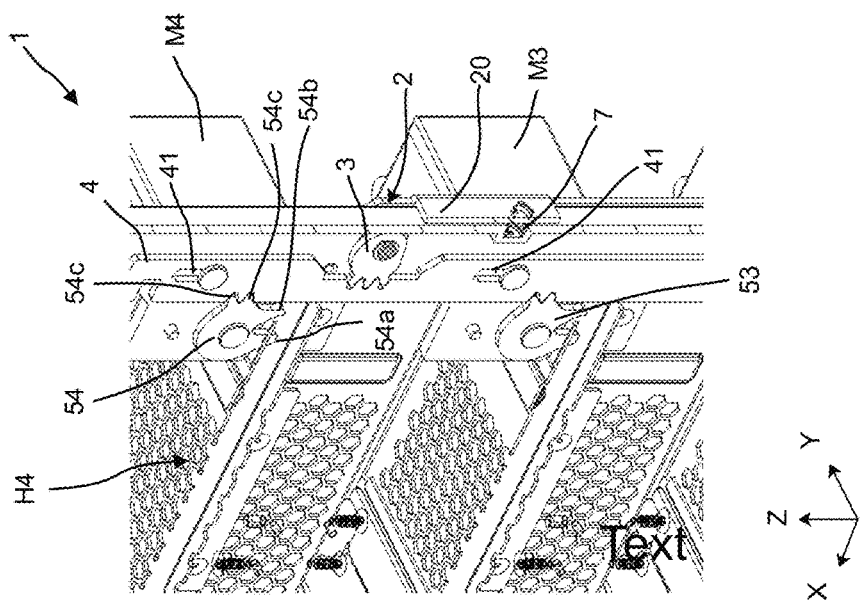
FIG. 8 is a zoom of the pinion/rack mechanism of the interconnecting module.

In this embodiment, each connection unit M1-M4 comprises two fastening members 51-54 which are all similar (one at each side of the vertical rack 4). Each fastening member 51-54 is preferably a pivotable pinion. As represented in FIG. 8, the fastening member 54 comprises two primary teeth 54a, 54b for cooperating with the housing H4 of a computing unit A4 and at two secondary teeth 54c for cooperating with the vertical rack 4. The angular position of the fastening member 51-54 is modified by the vertical position of the vertical rack 4 as it will be described later. Each fastening member 51-54 defines a disengaging position where the primary teeth 54a, 54b can slide freely relatively from the housing H4 and an engaging position where the primary teeth 54a, 54b extend vertically to the bottom in order to cooperate with the housing H4. In this example, the diameter of the fastening member 51-54 is about 25 mm.

As represented in FIG. 7, the vertical rack 4 extends vertically along all the computing units A1-A4. The vertical rack 4 is located on the front part of the interconnecting module 1 and cooperates with all the fastening member 51-54 according to a rack/pinion mechanism. The vertical rack 4 comprised tooth portions which are engaged with the secondary teeth 54c of each fastening member 51-54. In this example, the vertical rack 4 is guided vertically, for example with several pin/slot mechanisms 41, relatively from the chassis 10. In this example, the vertical rack 4 can translate vertically along a translation distance comprised between 5 mm and 10 mm.

As represented in FIG. 7, the main lever 2 is mounted pivotally along a Y1 axis (FIG. 4) on the chassis 10, the main lever 2 being configured to move the vertical rack 4 vertically in order to engage/disengage all the fastening members 51-54 simultaneously. The length of the main lever 2 is preferably over 200 mm to provide a good lever effect to amplify the user force. The main lever 2 comprises a main pinion 3 cooperating with the vertical rack 4, more precisely, with a toothed portion. In this example, the vertical rack 4 is located between the fastening members 51-54 and the main pinion 3. The main pinion 3 is linked to the main lever 2 in rotation so that the rotation of the main lever 2 leads to the rotation of the main pinion 3. In this example, the diameter of the main pinion 3 is about 20 mm.

Figure 11:
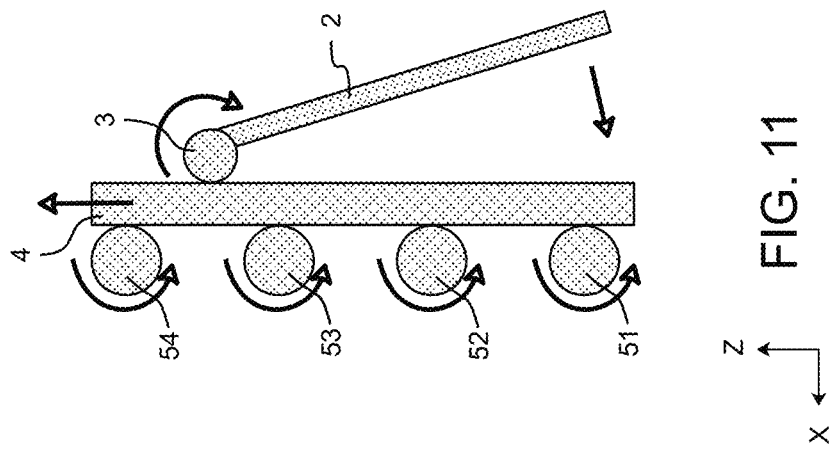
FIG. 11 is a schematic view of the pinion/rack mechanism during engagement.
Figure 10:
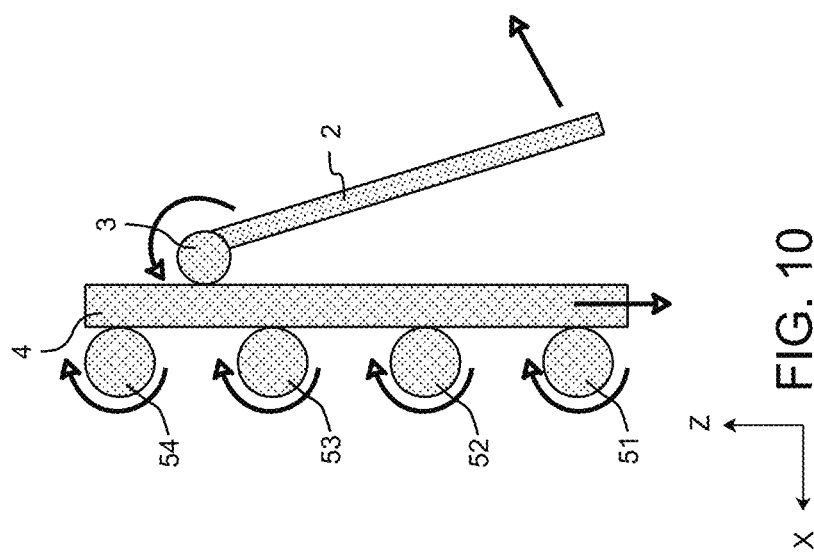
FIG. 10 is a schematic view of the pinion/rack mechanism during disengagement.
Figure 9:
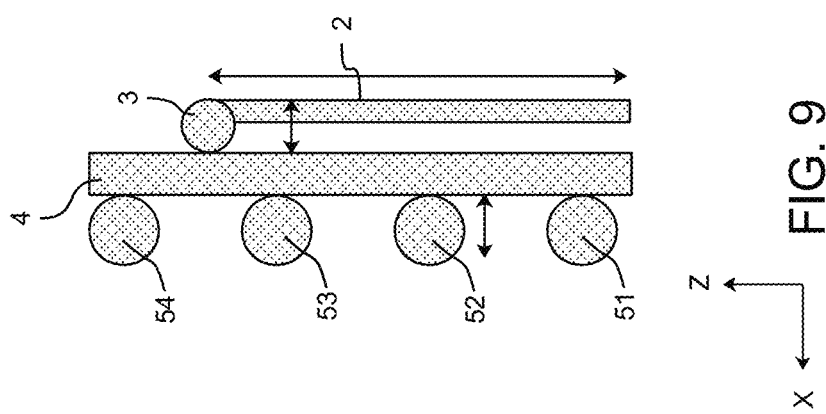
FIG. 9 is a schematic view of the pinion/rack mechanism in the engaged position.

The rack/pinion mechanism will be now presented in reference to FIGS. 9 to 11 which represent schematically the fastening members 51-54, the vertical rack 4, the main pinion 3 and the main lever 2.

FIG. 9 represents the engaging position of the interconnecting module 1, when each fastening member 51-54 is in the engaging position. For disengaging the interconnecting module 1, according to FIG. 10, the user moves the main lever 2 in the upper position (anticlockwise rotation) which rotates the main pinion 3 (anticlockwise rotation) which moves vertically the vertical rack 4 in a lower position and which rotates simultaneously all the fastening members 51-54 (clockwise rotation) in a disengaging position. Similarly, for engaging the interconnecting module 1, according to FIG. 11, the user moves the main lever 2 in the lower position (clockwise rotation) which rotates the main pinion 3 (clockwise rotation) which moves vertically the vertical rack 4 in an upper position and which rotates simultaneously all the fastening members 51-54 (anticlockwise rotation) in an engaging position. In this example, a user force of 60N can be converted in 4 mating forces of 360N.

Figure 12:
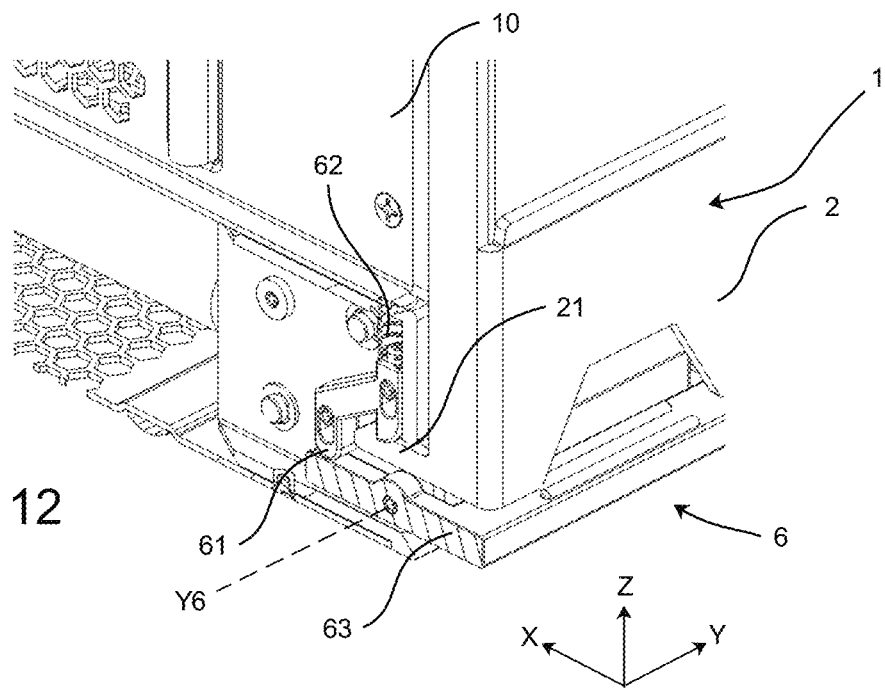
FIG. 12 is an isometric view of a locking system of the main lever.

As represented in FIG. 12, the interconnecting module 1 comprises a locking system 6 configured to lock the main lever 2 in the lower position. The locking system 6 is located at the bottom of the interconnecting module 1 and is configured to lock a hook portion 21 of the main lever 2. In this example, the hook portion 21 is formed at the extremity of the main lever 2. The locking system 6 comprises a pushing member 61 configured to lock the hook portion 21. The pushing member 61 is configured to translate vertically relatively to the chassis 10, a pushing spring 62 being configured to exert a downward force on the pushing member 61.

The locking system 6 also comprises a releasing handle 63 configured to be manipulated by a user in order to exert a force against the pushing spring 62 to release the main lever 2. In this example, the pushing member 61 is located on the rear of the main lever 2 and is not directly accessible by the user. The releasing handle 63 is mounted pivotable according to a Y6 axis so that a user can exert a force on a front portion of the releasing handle 63 to move the rear portion of the releasing handle 63 to exert an upward force against the pushing member 61 and the pushing spring 62. In this example, the pushing member 61 comprises two arms in order to cooperate respectively with the hook portion 21 and the releasing handle 63. Thanks to the locking system 6, the main lever 2 can be securely locked to avoid an inadvertent disengaging.

Figure 23:
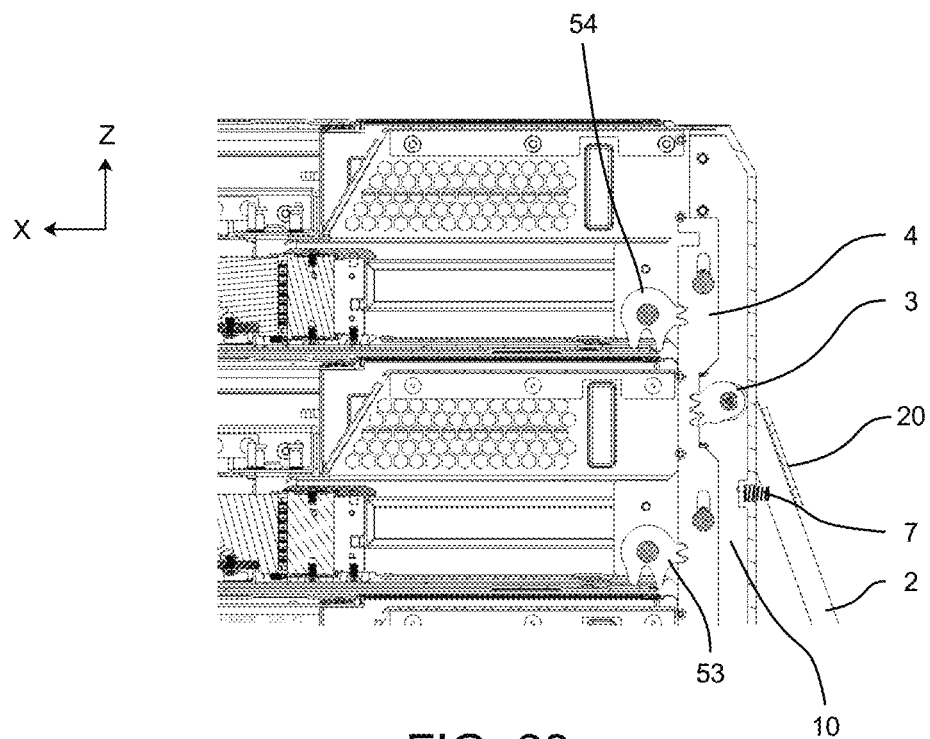
FIG. 23 is cut view of the main lever during disengagement.

As represented in FIG. 23, the interconnecting module 1 comprises an opening spring 7, mounted between the main lever 2 and the chassis 10, which is configured to move the main lever 2 towards the upper position when the main lever 2 is unlocked. Such an opening spring 7 is advantageous because it makes the user understand that the main lever 2 has to be moved towards the upper position after unlocking. During the locking, the user has to exert a force against the opening spring 7. To cooperate efficiently with the opening spring 7, the main lever 2 comprises a wall member 20.

Figure 13:
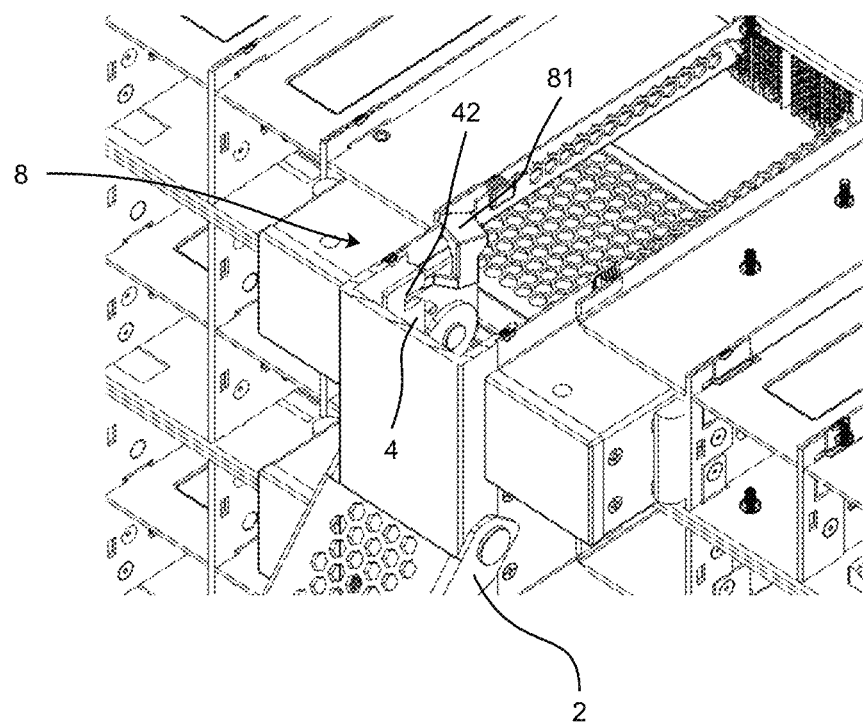
FIG. 13 is an isometric view of a supporting system of the main lever.

According to an aspect of the invention, as represented in FIG. 13, the interconnecting module 1 comprises also a supporting system 8 configured to support the main lever 2 in the upper position. Because of its weight, the main lever 2 tends to move toward the lower position. The supporting system 8 keeps the main lever 2 in the upper position so that the user can move the interconnecting module 1 without paying attention to the main lever 2.

In this example, at the top of the interconnecting module 1, the supporting system 8 comprises a holding member 81 configured to move between an active position in which the holding member 81 cooperates with the vertical rack 4 and an inactive position in which the holding member is spaced from the vertical rack 4. In this example, the vertical rack 4 comprises a notch 42 to receive the holding member 81 in the active position.

The holding member 81 is pivotable along a vertical axis and can be advantageously moved from the active position to the inactive position by contact with the computing unit A4 during horizontal insertion. The main lever 2 is freed automatically during insertion. Preferably, the supporting system 8 comprises a spring configured to push the holding member 81 in the active position so that the main lever 2 is maintained automatically in the upper position when the user moves the main lever 2 to the upper position. Advantageously, in the upper position, the fastening members 51-54 are in the disengaging position.

The locking system 6, the opening spring 7 and the supporting system 8 are optional but are useful for the user which wants to engage/disengage an interconnecting module 1 effortlessly.

It will now be described a method for engaging an interconnecting module 1 into the computing units A1-A4 which are located in a HPC cabinet. For sake of clarity, the HPC cabinet is not represented.

Figure 14:
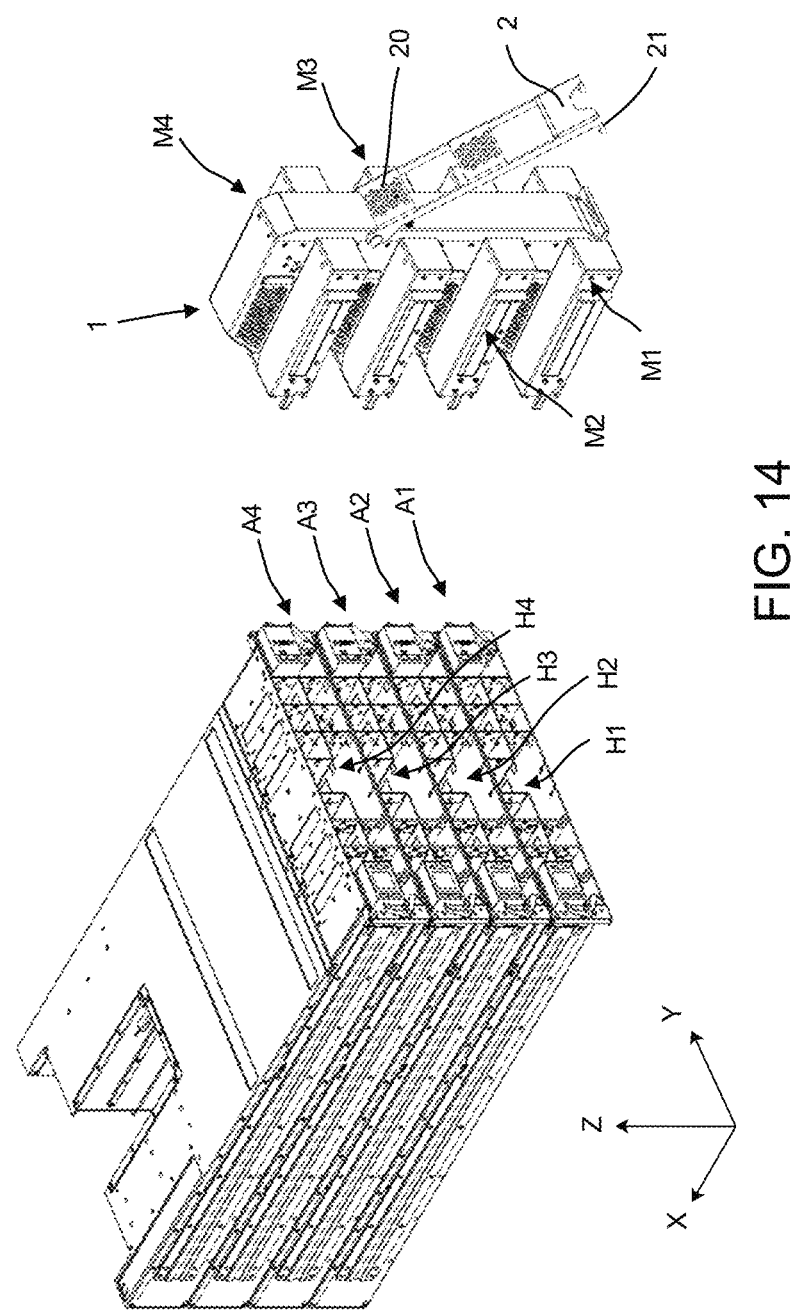
FIG. 14 is an isometric view of the interconnecting module spaced apart from the computing units.
Figure 15:
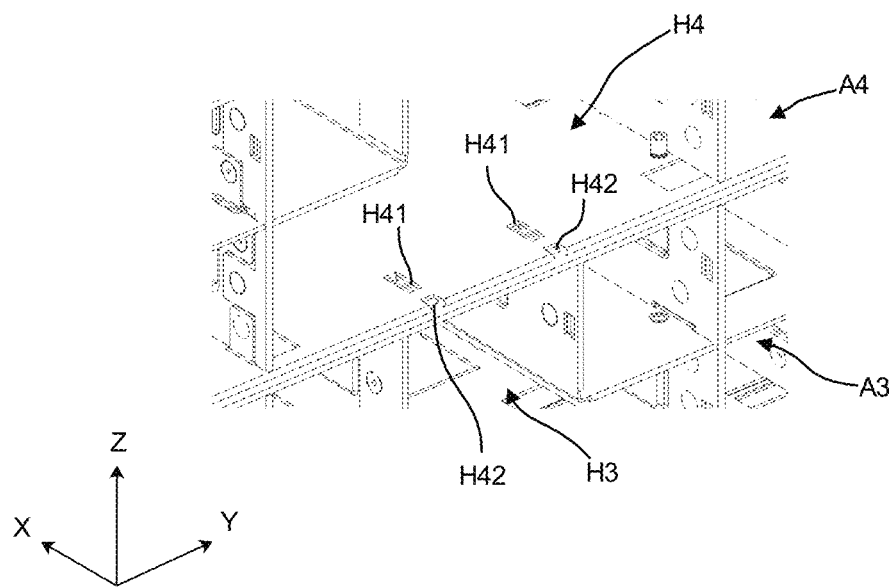
FIG. 15 is an isometric view of a computing unit housing.

As represented in FIG. 14, the computing units A1-A4 comprise four housings H1-H4 spaced vertically to receive the four connecting units M1-M4 of the interconnecting module 1. In this initial position, the interconnecting module 1 is spaced apart from the computing units A1-A4. The main lever 2 is in the upper position thanks to the supporting system 8 (not represented). As represented in FIG. 15, the housing H4 of a computing unit A4 comprises cut-outs H41, H42 (2 sets comprising each one opening H41 and one notch H42) configured to cooperate with the two fastening members 54 of the associated connecting unit M4. As it will be seen later, each fastening member 54 cooperates with one opening H41 and one notch H42.

Figure 16:
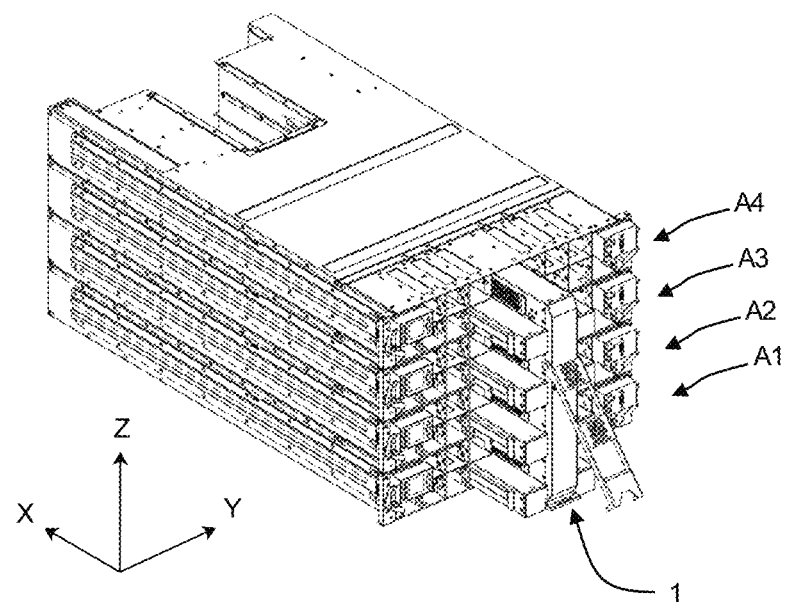
FIG. 16 is an isometric view of the interconnecting module during insertion in the computing units.
Figure 17:
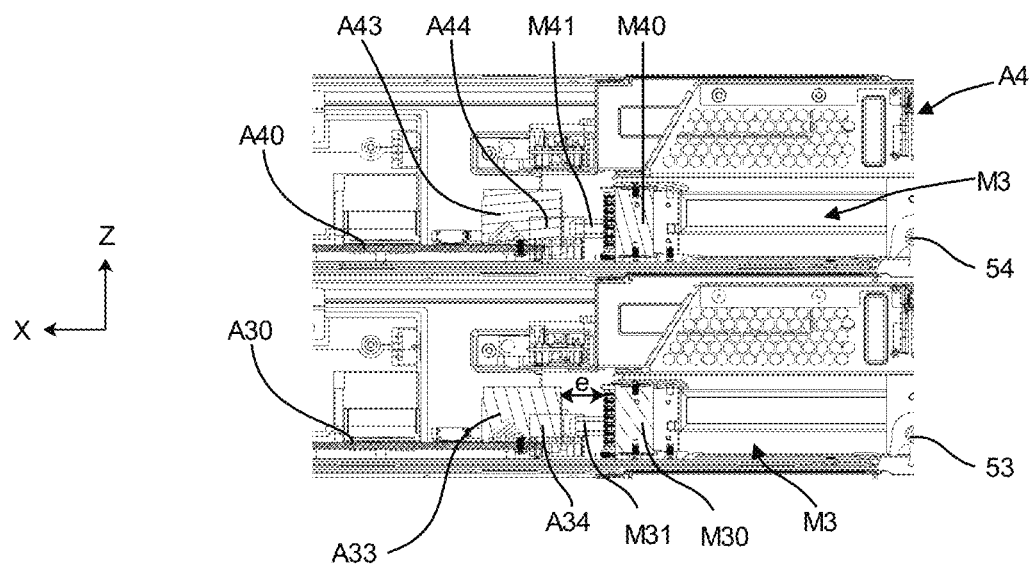
FIG. 17 is cut view of the connectors during insertion.

Then, as represented in FIG. 16, during an insertion step, the user moves the interconnecting unit 1 into the housings H1-H4 by a translating movement to the rear. As representing in FIG. 17, the guiding members M31-M41 of each connecting unit M3-M4 are guided within their respective reception members A34-A44. The guidance is optimal because of the plurality of guiding members which are spaced vertically. Each connecting unit M1-M4 is advantageously guided similarly.

After this insertion step, the connectors M30-M40 from the connecting units M3-M4 are still spaced apart from the front connectors A33, A43 by a distance e. Preferably during the insertion step, the holding member 81 is pivoted by contact with a housing wall of the computing unit A4 in an inactive position. The vertical rack 4 is freed and the main lever 2 moves slightly toward the lower position showing the user that the connection step can be initiated.

It will now be presented a connection step. As presented before in FIG. 11, the main lever 2 is moved to the lower position (clockwise rotation) which rotates the main pinion 3 (clockwise rotation).

Figure 18:
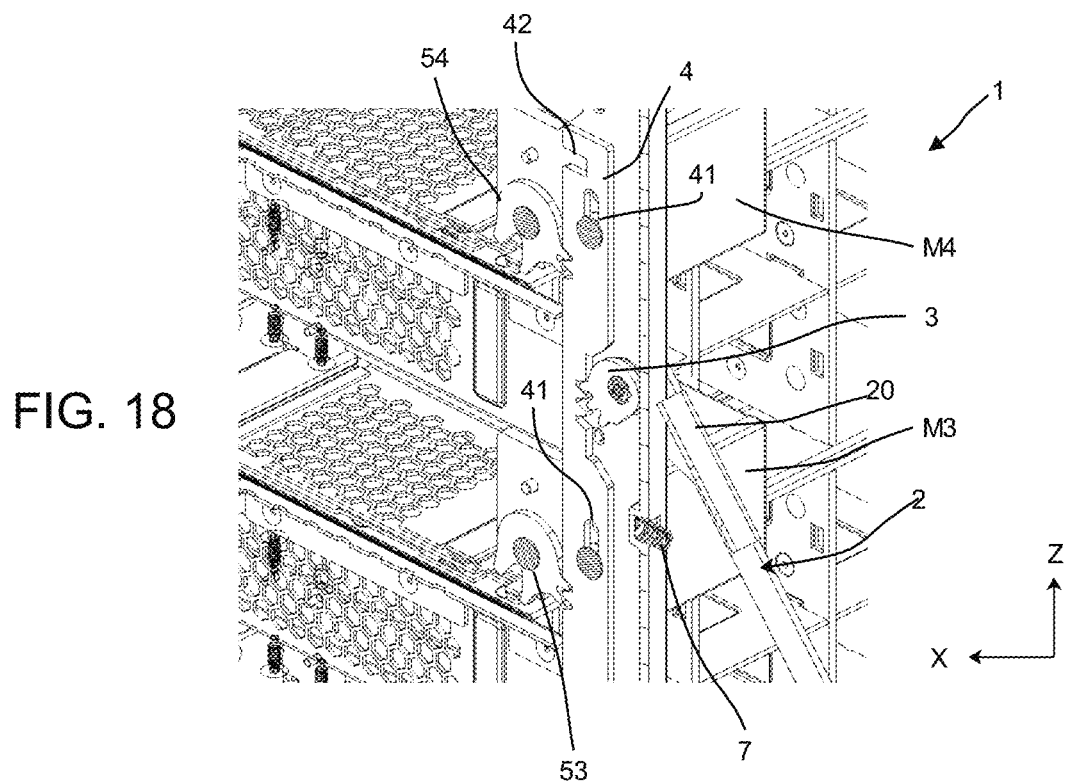
FIG. 18 is cut view of the interconnecting module during connection.
Figure 19:
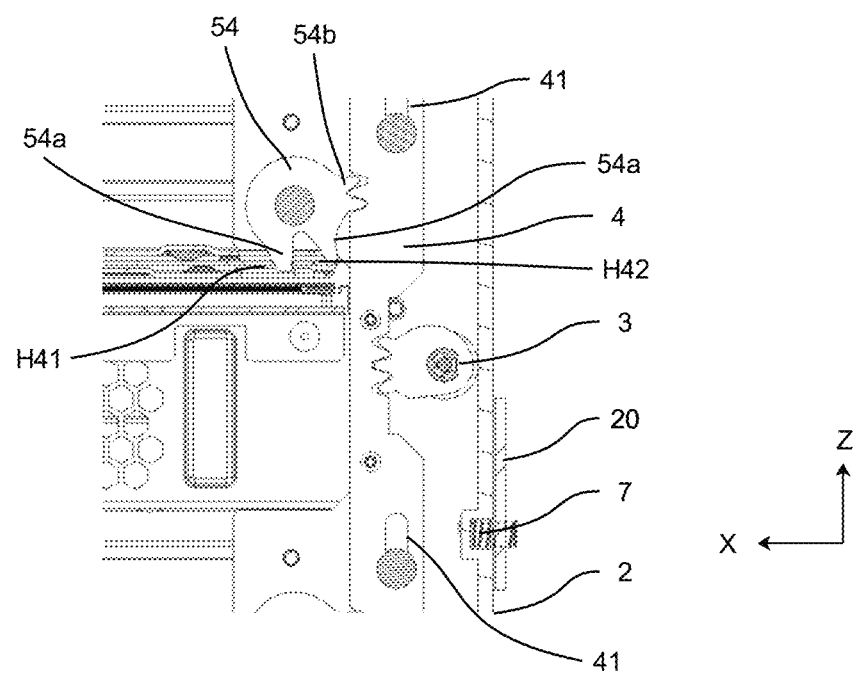
FIG. 19 is cut view of the fastening members after connection.
Figure 20:
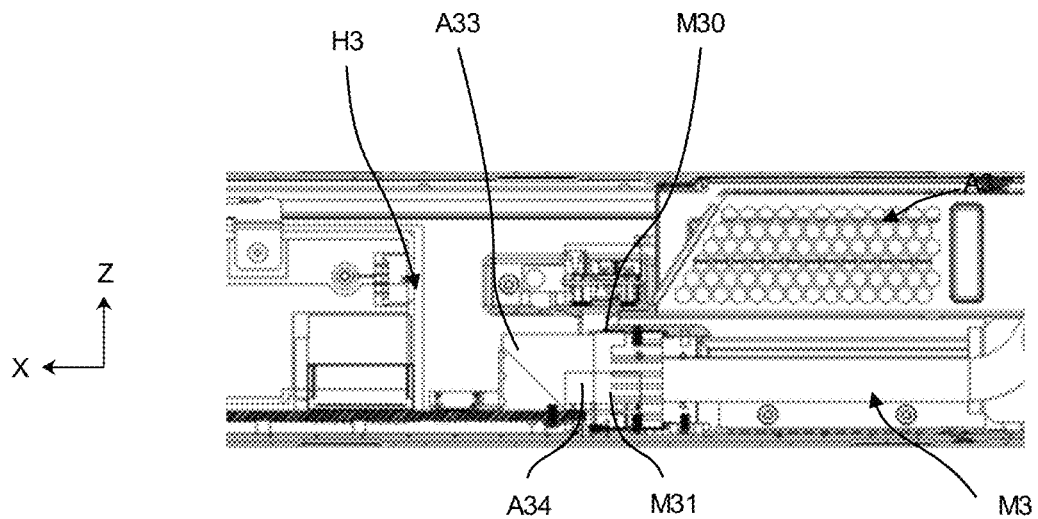
FIG. 20 is cut view of the connectors after connection.
Figure 21:
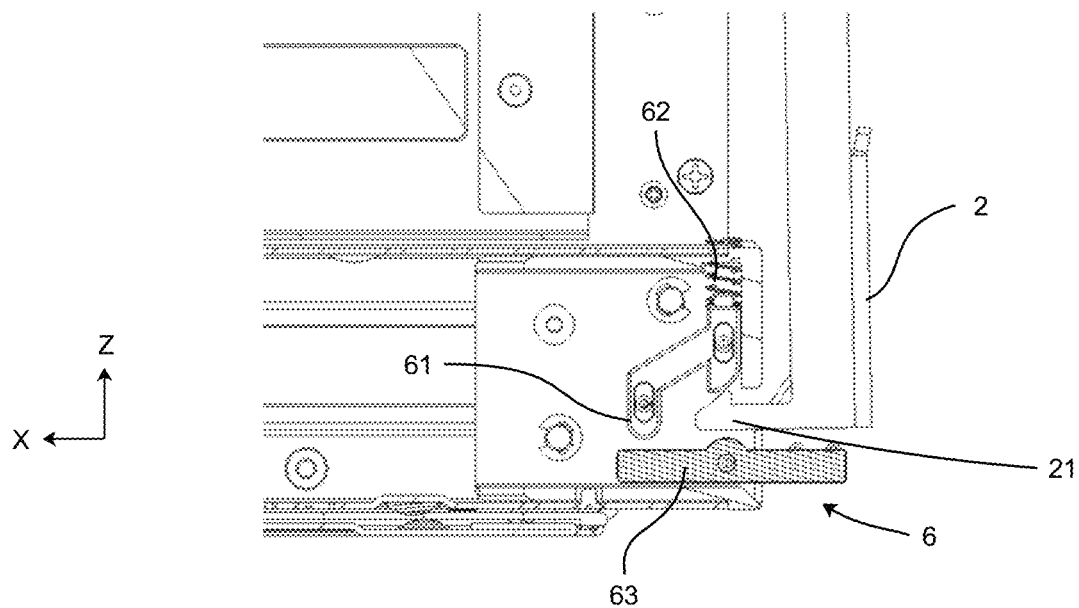
FIG. 21 is cut view of the locking system during connection.

As represented in FIG. 18, the teeth of the main pinion 3 moves vertically the vertical rack 4 in an upper position which rotates simultaneously all the fastening members pinion 51-54 (anticlockwise rotation) in an engaging position. Thanks to the main lever 2 and to the rack/pinion mechanism, the strength of the user is amplified and divided equally to each fastening members 51-54 so that the connectors M30 from the connecting units M3 can mate with the front connectors A33 of the motherboards perfectly as represented in FIG. 20. The risk of damage is decreased. In the engaging position, as represented in FIG. 19, a primary tooth 54a of each fastening member 54 is located in an opening H41 of the housing H4. The engagement is therefore secured. During the connection step, the opening spring 7 is biased and the hook portion 21 of the main lever 2 is locked automatically by the pushing member 61 (see FIG. 21). The main lever 2 cannot be accidentally opened.

The interconnecting module 1 is inserted and connected so that the computing units A1-A4 can all work together. The scalability is increased effortlessly for the user.

It will now be described a method for disengaging the interconnecting module 1 from the computing units A1-A4, for example, for maintenance.

Figure 22:
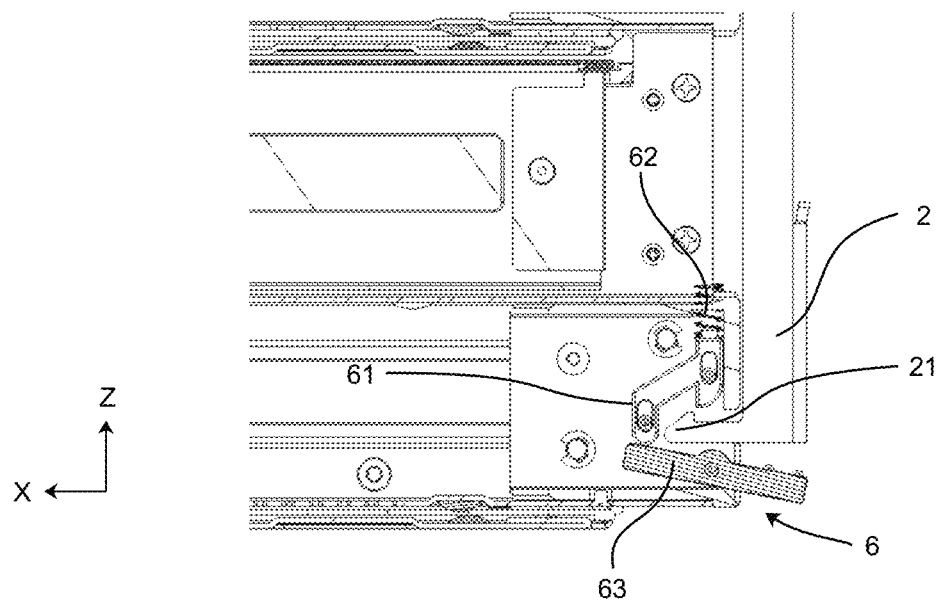
FIG. 22 is cut view of the locking system when the releasing handle is used for disengagement.

As represented in FIG. 22, the user unlocks the main lever 2 by pushing the releasing handle 63 which pushes the pushing member 61 and releases the hook portion 21. Thanks to the unlocking, the opening spring 7 moves the main lever 2 toward the upper position and shows the user that a disconnection step can be initiated.

As presented before in FIG. 10, the main lever 2 is moved to the upper position (anticlockwise rotation) which rotates the main pinion 3 (anticlockwise rotation). All the fastening members 51-54 rotates clockwise in the disengaging position. During disconnection, another primary tooth 54b of each fastening member 54 cooperates with a notch H42 so that to eject the interconnecting module 1 outside from the computing units A1-A4.

Again, thanks to the main lever 2 and to the rack/pinion mechanism, the strength of the user is amplified and divided equally to each fastening members 51-54 so that the connectors from the connecting units M1-M4 can be disconnected from the front connectors.

During disconnection and after ejection, the holding member 81 is automatically pushed towards the vertical rack 4 in order to cooperate with the notch 42 and hold the vertical rack 4 in the upper position without help from the user as represented in FIG. 13. The user can therefore pull the interconnecting module 1 to the front, out of the computing units A1-A4.

Thanks to the invention, the interconnecting module 1 can be engaged/disengaged effortlessly.

All terminologies used herein are for purposes of describing embodiments and examples and should not be construed as limiting the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by the person skilled in the art to which this present disclosure belongs. Furthermore, terms, such as those defined in commonly used dictionaries, should be interpreted as having a meaning that is consistent with their meaning in the context of the relevant art and will not be interpreted in an idealized or overly formal sense unless expressly defined herein.

While aspects of the present disclosure have been particularly shown and described with reference to the embodiments above, it will be understood by those skilled in the art that various additional embodiments may be contemplated by the modification of the disclosed methods without departing from the spirit and scope of what is disclosed. Such embodiments should be understood to fall within the scope of the present disclosure as determined based upon the claims and any equivalents thereof.

The invention claimed is:

1. An interconnecting module configured to be mounted in a High-Performance Computing (HPC) cabinet, in order to interconnect a plurality of computing units located in the HPC cabinet, the interconnecting module comprising:
    a chassis configured to be mounted horizontally within housings defined in the plurality of computing units,
    a plurality of connection units spaced vertically, each connection unit of the plurality of connection units being configured to be connected to a motherboard of a computing unit of the plurality of computing units, the plurality of connection units being interconnected,
    each connection unit of the plurality of connection units comprising at least a fastening member configured to cooperate with a housing of a computing unit of the plurality of computing units,
    at least a vertical rack cooperating with all fastening members of said each connection unit of the plurality of connection units and at least a main lever mounted pivotally on the chassis, the main lever being configured to move the vertical rack vertically in order to engage/disengage said all fastening members simultaneously.

2. The interconnecting module according to claim 1 wherein said plurality of connection units comprises at least four connection units and wherein said plurality of computing units comprises at least four computing units, such that said at least four connection units interconnect said at least four computing units located in the HPC cabinet.

3. The interconnecting module according to claim 1 in which each fastening member of said all fastening members is a pivotable pinion.

4. The interconnecting module according to claim 1 in which each fastening member of said all fastening members comprises at least a primary tooth configured to engage with a corresponding housing of said housings.

5. The interconnecting module according to claim 1 in which the main lever comprises a main pinion cooperating with the vertical rack.

6. The interconnecting module according to claim 1 in which the interconnecting module further comprises a locking system configured to lock the main lever in a lower position.

7. The interconnecting module according to claim 6 in which the locking system comprises a pushing member configured to cooperate with a hook portion of the main lever.

8. The interconnecting module according to claim 1 in which the main lever comprises a supporting system configured to maintain the main lever in an upper position.

9. The interconnecting module according to claim 8 in which the supporting system comprises a holding member configured to move between an active position in which the holding member cooperates with the vertical rack and an inactive position in which the holding member is spaced apart from the vertical rack.

10. An assembly comprising a plurality of computing units located in a High-Performance Computing (HPC) cabinet and an interconnecting module wherein the interconnecting module comprises:
    a chassis configured to be mounted horizontally within housings defined in the plurality of computing units,
    a plurality of connection units spaced vertically, each connection unit of the plurality of connection units being configured to be connected to a motherboard of a computing unit of the plurality of computing units, the plurality of connection units being interconnected,
    each connection unit of the plurality of connection units comprising at least a fastening member configured to cooperate with a housing of a computing unit of the plurality of computing units,
    at least a vertical rack cooperating with all fastening members of said each connection unit of the plurality of connection units and at least a main lever mounted pivotally on the chassis, the main lever being configured to move the vertical rack vertically in order to engage/disengage said all fastening members simultaneously.

11. The assembly according to claim 10, in which each computing unit of the plurality of computing units comprises a central housing for receiving a connection unit of the plurality of connection units of the interconnecting module.

12. The assembly according to claim 11, in which each computing unit of the plurality of computing units comprises a horizontal wall with cutouts for cooperating with the all fastening members of the plurality of connection units.

13. A method for engaging an interconnecting module a High-Performance Computing (HPC) cabinet to interconnect a plurality of computing units located in the HPC cabinet, the interconnecting module comprising
    a chassis configured to be mounted horizontally within housings defined in the plurality of computing units,
    a plurality of connection units spaced vertically, each connection unit of the plurality of connection units being configured to be connected to a motherboard of a computing unit of the plurality of computing units, the plurality of connection units being interconnected,
    each connection unit of the plurality of connection units comprising at least a fastening member configured to cooperate with a housing of a computing unit of the plurality of computing units,
    at least a vertical rack cooperating with all fastening members of said each connection unit of the plurality of connection units and at least a main lever mounted pivotally on the chassis, the main lever being configured to move the vertical rack vertically in order to engage/disengage said all fastening members simultaneously, the method comprising:
    inserting the plurality of connection units in corresponding housings of the housings of the plurality of computing units, and
    moving the main lever to a lower position to move the vertical rack vertically in order to engage said all fastening members simultaneously so that to connect the plurality of connection units to the plurality of computing units.

* * * * *